US012775301B2

(12) United States Patent
Gupta et al.

(10) Patent No.: US 12,775,301 B2
(45) Date of Patent: Oct. 27, 2026

(54) HIGH-SPEED DELTA SIGMA MODULATORS

(71) Applicant: Shaoxing Yuanfang Semiconductor Co., Ltd., Shaoxing (CN)

(72) Inventors: Akash Gupta, Bangalore (IN); Rakesh Kumar Gupta, Bangalore (IN); Shubham Paliwal, Bangalore (IN); Sajeeth Raj Srinivasan, Bangalore (IN); Harsha Bommalingappa, Bangalore (IN)

(73) Assignee: Ningbo Aura Semiconductor Co., Ltd, Ningbo (CN)

( * ) Notice: Subject to any disclaimer, the term of this patent is extended or adjusted under 35 U.S.C. 154(b) by 1 day.

(21) Appl. No.: 19/033,536

(22) Filed: Jan. 22, 2025

(65) Prior Publication Data

US 2026/0016851 A1 Jan. 15, 2026

(30) Foreign Application Priority Data

Jul. 11, 2024 (IN) ............................. 202441053087

(51) Int. Cl.

| | |
|---|---|
| ***G06F 1/06*** | (2006.01) |
| ***H03M 3/00*** | (2006.01) |
| *G06F 7/501* | (2006.01) |
| *G06F 7/523* | (2006.01) |
| *G06F 7/535* | (2006.01) |

(52) U.S. Cl.

CPC ................ *G06F 1/06* (2013.01); *H03M 3/30* (2013.01); *G06F 7/501* (2013.01); *G06F 7/523* (2013.01); *G06F 7/535* (2013.01)

(58) Field of Classification Search

CPC . G06F 1/06; G06F 7/535; G06F 7/523; G06F 7/501; H03M 3/30

See application file for complete search history.

(56) References Cited

U.S. PATENT DOCUMENTS

| | | | | |
|---|---|---|---|---|
| 6,707,855 B2 | 3/2004 | Patana | | |
| 6,944,257 B2 * | 9/2005 | Riley | ...................... H03L 7/081 | 327/117 |

OTHER PUBLICATIONS

Paolo Madoglio et al, A 2.5-GHz, 6.9-mW, 45-nm-LP Cmos, ΔΣ Modulator Based on Standard Cell Design With Time-Interleaving, Jul. 2010, 11 Pages, IEEE Journal of Solid-State Circuits.

(Continued)

*Primary Examiner* — Joseph J Lauture

(74) *Attorney, Agent, or Firm* — IPHORIZONS PLLC; Narendra Reddy Thappeta

(57) ABSTRACT

A Delta Sigma Modulator (DSM) includes a first memory element, a second memory element, a first adder and a second adder. The first memory element generates a sequence of sums. The second memory element generates a sequence of carries. An output of the first adder is connected to an input of the first memory element. An output of the second adder is coupled to an input of the second memory element. Multiple signal paths are formed between a start point of a set of start points and an end point of a set of end points. The set of start points include inputs to the DSM and data output of the first memory. The set of end points include inputs of the first memory element and the second memory element. Only a single one of the first adder and the second adder is present in the signal paths.

15 Claims, 5 Drawing Sheets

(56) References Cited

OTHER PUBLICATIONS

F. Colodro et al, Open loop sigma-delta modulators for digital-to-analog converters with high-speed improving using time interleaving, AEUE—International Journal of Electronics and Communications 125 (2020), Jul. 30, 2020, 07 pages.
Pramod Kumar Meher et al, Critical-Path Analysis and Low-Complexity Implementation of the LMS Adaptive Algorithm, IEEE Transactions on Circuits and Systems—I: Regular Papers, Mar. 2014, 11 pages.
Jesper Johansson et al, A novel speculative pseudo-parallel ΔΣ modulator, 2014, 05 pages.
A. Frappe et al, Design techniques for very high-speed digital delta-sigma modulators aimed at all-digital RE transmitters, Dec. 2006, 04 pages, IEEE.
Ameya Bhide et al, Critical Path analysis of two channel interleaved digital Mash ΔΣ modulators, Nov. 2013, 04 pages, IEEE.
Ameya Bhide et al, An 8-GS/s 200-MHz Bandwidth 68-mW ΔΣ DAC in 65-nm Cmos, IEEE Transactions on Circuits and Systems—II: Express Briefs, Jul. 2013, 05 pages.

* cited by examiner

460

| | 461 | 462 | 463 | 464 | 465 | 466 | 467 | 468 | 469 |
|---|---|---|---|---|---|---|---|---|---|
| | Clk 405 (f-div) | 402 (P) | 412 | 423 | 435 (Ndtc) (sum) | 437 [2^3- (Q-P)] | 442 | 445 | 455 (Ndiv1) (carry) |
| 481 → | 0 | 011 (3) | 011 (3) | 011 (3) | 000 (0) | 110 (6) | 110 (6) | 0 (0) | 0 (0) |
| 482 → | 1 | 011 (3) | 110 (6) | 001 (1) | 011 (3) | 110 (6) | 001 (1) | 1 (1) | 0 (0) |
| 483 → | 2 | 011 (3) | 100 (4) | 100 (4) | 001 (1) | 110 (6) | 111 (7) | 0 (0) | 1 (1) |
| 484 → | 3 | 011 (3) | 111 (7) | 010 (2) | 100 (4) | 110 (6) | 010 (2) | 1 (1) | 0 (0) |
| 485 → | 4 | 011 (3) | 101 (5) | 000 (0) | 010 (2) | 110 (6) | 000 (0) | 1 (1) | 1 (1) |
| 486 → | 5 | 011 (3) | 011 (3) | 011 (3) | 000 (0) | 110 (6) | 110 (6) | 0 (0) | 1 (1) |
| 487 → | 6 | 011 (3) | 110 (6) | 001 (1) | 011 (3) | 110 (6) | 001 (1) | 1 (1) | 0 (0) |
| 488 → | 7 | 011 (3) | 100 (4) | 100 (4) | 001 (1) | 110 (6) | 111 (7) | 0 (0) | 1 (1) |
| 489 → | 8 | 011 (3) | 111 (7) | 010 (2) | 100 (4) | 110 (6) | 010 (2) | 1 (1) | 0 (0) |
| 490 → | 9 | 011 (3) | 101 (5) | 000 (0) | 010 (2) | 110 (6) | 000 (0) | 1 (1) | 1 (1) |
| 491 → | 10 | 011 (3) | 011 (3) | 011 (3) | 000 (0) | 110 (6) | 110 (6) | 0 (0) | 1 (1) |

*FIG. 4B*

HIGH-SPEED DELTA SIGMA MODULATORS

PRIORITY CLAIM

The instant patent application is related to and claims priority from the co-pending India provisional patent application entitled, "HIGH SPEED MULTI-BIT ACCUMULATOR IMPLEMENTATION WITH SEGMENTED STAGES", Serial No.: 202441053087, Filed: 11 Jul. 2024, which is incorporated in its entirety herewith to the extent not inconsistent with the description herein.

BACKGROUND

Technical Field

Embodiments of the present disclosure relate generally to delta-sigma modulators (DSMs), and more specifically to high-speed DSMs.

Related Art

Delta-sigma modulators (DSMs) are often used to realize fractions. A DSM typically receives a desired 'fraction' (specified by a numerator and a denominator), and generates a sequence of correlated code pairs which together are used to realize the desired fraction, as is well known in the relevant arts.

DSMs find use, among others, in open-loop modulator (OLM) circuits (also known as Open Loop Fractional Divider or Fractional Frequency Divider) for generating an output clock whose frequency is a desired fraction of that of a reference clock, as is well known in the relevant arts.

There is a general recognized need to operate the DSMs at high speeds. Aspects of the present disclosure are directed to high-speed DSMs.

BRIEF DESCRIPTION OF THE VIEWS OF DRAWINGS

Example embodiments of the present disclosure will be described with reference to the accompanying drawings briefly described below.

FIG. 4B is a diagram showing a table with example entries of signal values at several nodes of the DSM of FIG. 4A, and is used to illustrate the operation of the DSM of FIG. 4A.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

Aspects of the present disclosure are directed to a Delta Sigma Modulator (DSM). According to an aspect of the present disclosure, a DSM includes a first memory element, a second memory element, a first adder and a second adder. The first memory element generates a sequence of sums. The second memory element generates a sequence of carries. An output of the first adder is coupled to an input of the first memory element. An output of the second adder is coupled to an input of the second memory element. Multiple signal paths are formed between a start point of a set of start points and an end point of a set of end points. The set of start points include inputs to the DSM and data output of the first memory. The set of end points include inputs of the first memory element and the second memory element. Only a single one of the first adder and the second adder is present in any of the signal paths. Operation at higher clock frequencies is made possible due to such features.

In an embodiment of the present disclosure, the DSM is a first-order DSM.

Several aspects of the present disclosure are described below with reference to examples for illustration. However, one skilled in the relevant art will recognize that the disclosure can be practiced without one or more of the specific details or with other methods, components, materials and so forth. In other instances, well known structures, materials, or operations are not shown in detail to avoid obscuring the features of the disclosure. Furthermore, the features/aspects described can be practiced in various combinations, though only some of the combinations are described herein for conciseness.

2. Example Device

Figure 1:
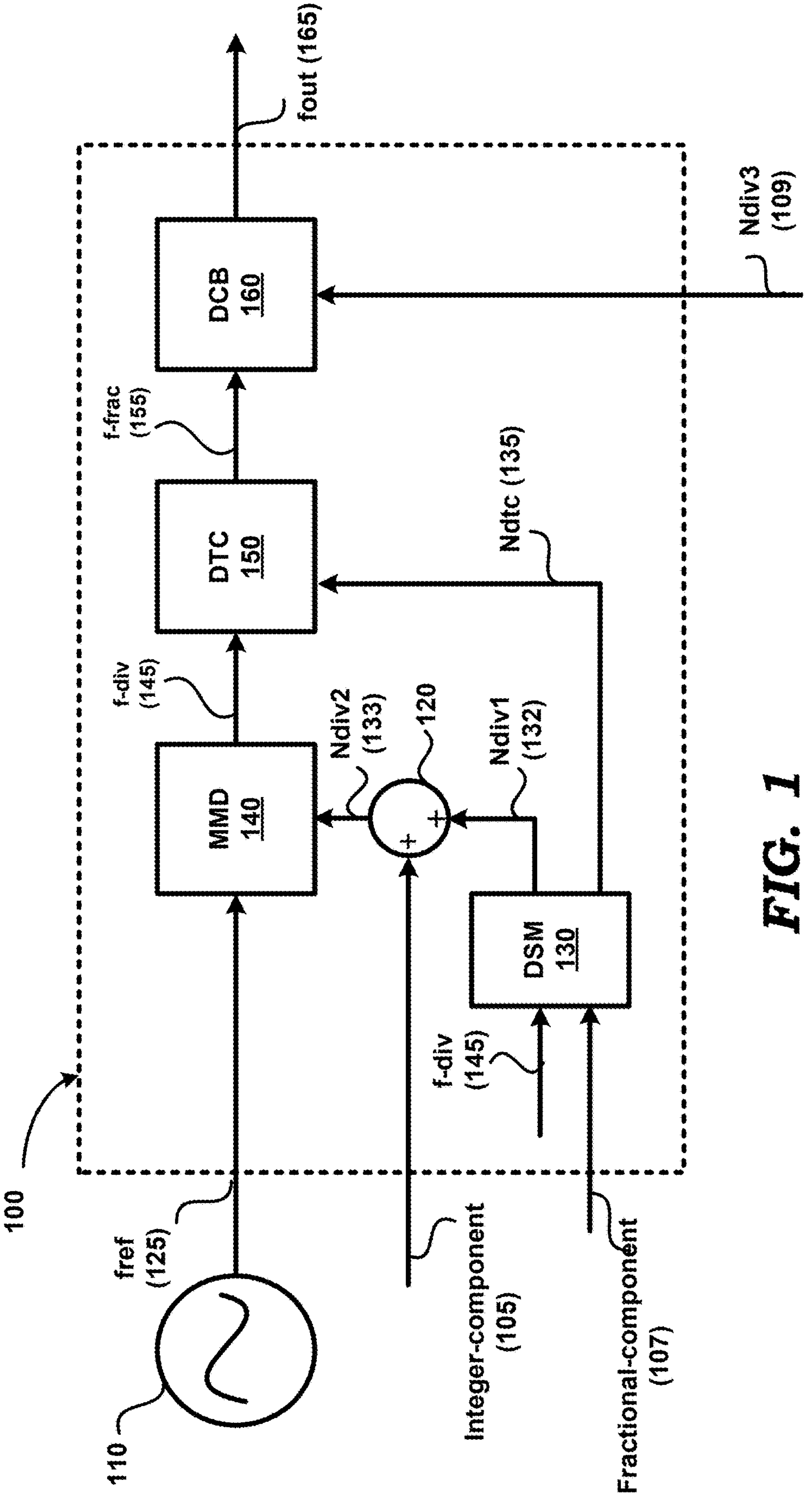
FIG. 1 is a diagram illustrating the details of an example device in which several aspects of the present disclosure can be implemented, in an embodiment of the present disclosure.

FIG. 1 is a diagram illustrating the details of an example device in which several aspects of the present disclosure can be implemented. FIG. 1 depicts an open-loop-modulator (OLM) 100 (also known as Open Loop Fractional Divider or Fractional Frequency Divider) implemented according to aspects of the present disclosure. OLM 100 generates output clock (fout) on path 165 from reference clock 'fref' received from clock generator 110 (e.g., phase-locked loop, oscillator, etc.) on path 125, and is shown containing adder 120, delta-sigma modulator (DSM) 130, multi-modulus divider (MMD) 140, digital-to-time converter (DTC) 150 and duty cycle block (160). It is noted herein that only components as relevant to the understanding of the disclosure are depicted in FIG. 1. It is understood that OLM 100 can contain more or fewer blocks than those shown in FIG. 1. Although the illustrative embodiment depicts an open-loop modulator, aspects of the present disclosure can be equally applied to fractional Phase Locked Loops (PLL) also with corresponding modifications, as will be apparent to a skilled practitioner by reading the disclosure herein. OLM 100 operates to divide the frequency of fref (125) by a divisor, which may be a mixed number (e.g., 3.5) or a proper fraction (e.g., 0.5).

MMD 140 represents a frequency divider and receives reference clock fref (125) and code Ndiv2 (which represents an integer divisor value) on path 133. MMD 140 divides the frequency of fref by the value of Ndiv2 to generate divided clock f-div on path 145. To cause MMD 140 to divide fref (125) by a desired fraction, the values of Ndiv2 (133) are suitably generated by DSM 130 (and adder 120) in a known way, and as illustrated with an example in FIG. 2. The values of Ndiv2 are typically a periodic sequence of integers, with MMD 140 dividing fref (125) in successive time intervals by corresponding integers in the periodic sequence. As will be described below, code Ndiv2 (133) may be a sequence of a set of 'lower value(s)' (e.g., all 4) and a set of higher value(s) (e.g., 5). Division of the frequency of fref (125) by MMD 140 by the periodic sequence of integers Ndiv2 (133) generates f-div (145) such that the cycles of f-div (145) corresponding to when Ndiv2 has a lower magnitude have shorter durations/periods while the cycles of f-div (145) corresponding to when Ndiv2 has a greater magnitude have longer durations/periods, as is illustrated and described below with reference to FIG. 2.

DTC 150 delays each edge of interest (either falling or rising edge, depending on the specific implementation) of divided clock f-div (145) by a duration specified by a corresponding value of code Ndtc received on path 135 to generate fractional divided clock f-div on path 155. In the disclosure herein, DTC 150 delays falling edges only. As is well-known in the relevant arts, the frequency of divided clock f-div is not constant, and changes whenever the value of Ndiv2 changes. DTC 150 operates to delay the falling edges by corresponding durations to cause all intervals from each falling edge to the next edge of f-frac (155) to be equal. In an example embodiment, each of such intervals equals half the period of the desired output clock fout (165).

Duty Cycle Block (DCB) 160 generates output clock fout on path 165 from clock f-frac received on path 155. In an embodiment, DCB 160 is a frequency divider that divides frequency of f-frac (155) by an even number (specified by Ndiv3). The division generates fout with a 50% duty cycle. Clock fout (165) represents the output clock of OLM 110. If DCB 160 is not implemented, f-frac (155) represents the output clock of OLM 100, but has a non-50% duty cycle.

MMD 140, DTC 150 and DCB 160 can be implemented in a known way.

The divisor (such as for example, 4.25), by which the frequency of fref is to be divided by OLM 100 (or more specifically by MMD 140) to generate fout (165), has an integer portion (integer-component) (105) (4 in the above example), and a fractional portion (fractional-component (107) (0.25 in the above example). That is, the frequencies fref and fout are related as 'fout=fref/divisor'. The integer-component (105) is any integer greater than or equal to 1. In an embodiment, the fractional-component (107) is represented by a pair of positive integers P and Q that respectively are the numerator and the denominator of the proper fraction P/Q, with P being less than Q. It is noted here that 'integer-component' (105) and 'fractional-component' (107) may be scaled up (increased) proportionately if Ndiv3 (109) is greater than 1. For example, if Ndiv3 equals 2, then the divisor is increased by a factor of 2.

DSM 130 receives as inputs on path 107, integers representing P and Q. According to the received numbers P and Q, for each clock cycle of clock f-div (145), DSM 130 generates a pair of correlated code/values Ndiv1 (which is forwarded on path 132) and Ndtc (which is forwarded on path 135). DSM 130 receives clock f-div (145) as another input. The first value of each pair is an integer and the second value of each pair indicates a delay. Over time, the code-pair sequence generated by DSM 130 repeats.

Although, adder 120 is shown separate from DSM 130 for clarity, adder 120 may be implemented within DSM 130 to add integer-component (105) and Ndiv1 (132) to generate Ndiv2 (133). When viewed thus, Ndiv2 rather than Ndiv1 would be one output of DSM 130.

As an example, if P and Q are 1 and 4 respectively (which correspond to, and 'represent' the, fractional portion of the divisor by which the frequency of fref is to be divided by OLM 100), DSM 130 generates a repeating sequence of code pairs [(0, 1), (0, 2), (0, 3) and (1, 0)]. The first value Ndiv1 of each pair in the repeating sequence is either a 0 or a 1. Adder 120 adds each of the received Ndiv1 values to the integer-component (105) and forwards the resulting value on path Ndiv2 (133). The integer-component (105) is a fixed integer (e.g., 4 in the example above). The second value Ndtc (135) of each pair specifies a corresponding duration of time by which the corresponding (falling) edge of f-div (145) is to be delayed.

Figure 2:
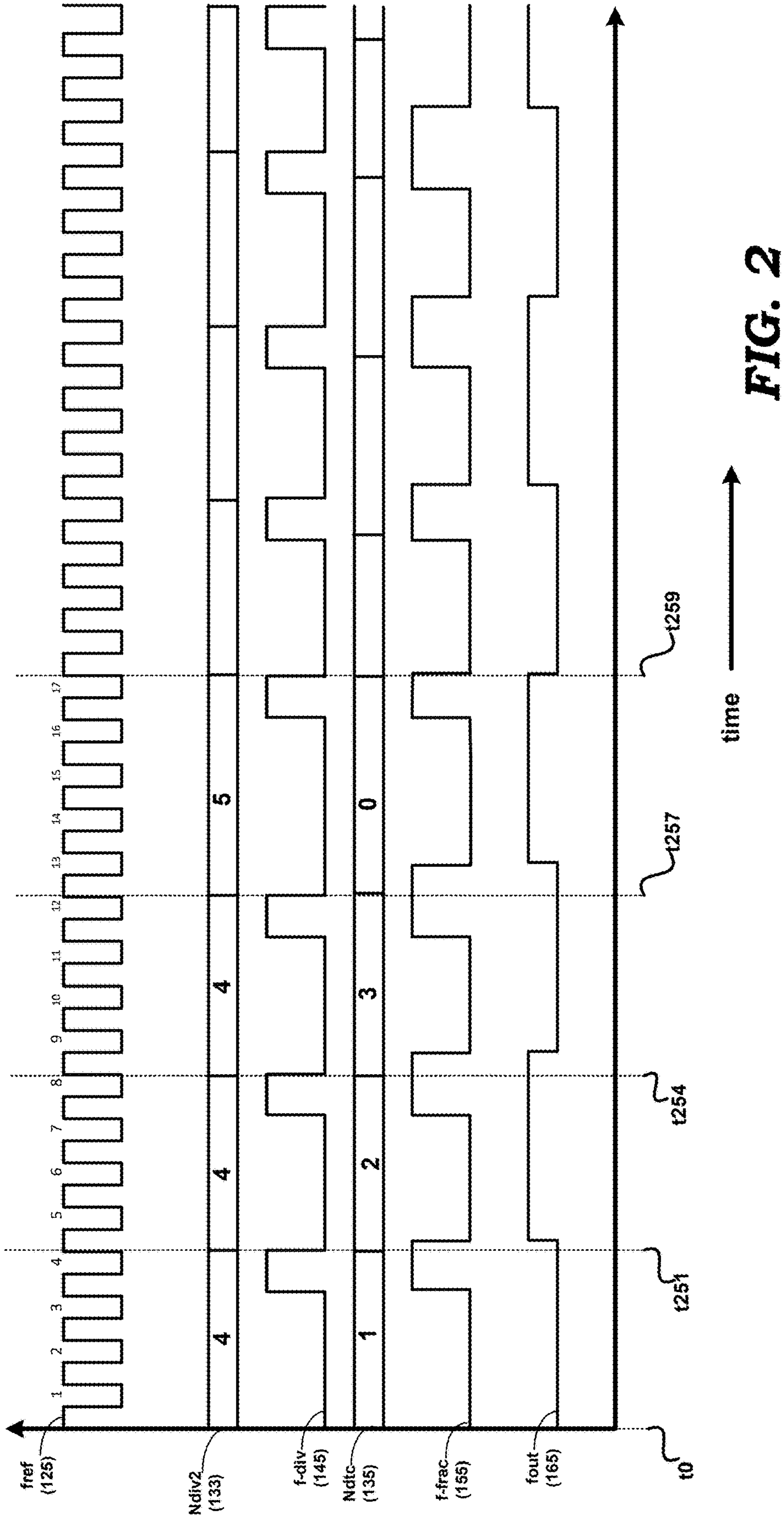
FIG. 2 is an example timing diagram illustrating waveforms generated at various nodes of an open loop modulator when performing a fractional division, in an embodiment of the present disclosure.

FIG. 2 is an example timing diagram (not to scale) illustrating waveforms generated at various nodes of OLM 100 when DSM 130 and MMD 140 are to perform fractional division by 4.25, and with DCB 160 to further divide f-frac by 2. Ndiv2 133 is shown as a repeating sequence 4, 4, 4, 5 (with corresponding Ndiv1 132 being a repeating sequence of 0, 0, 0, 1 (not shown in FIG. 2)). Ndtc 135 is shown as a repeating sequence 1, 2, 3, 0, each of which represents a delay of 1 time unit when the maximum delay (corresponding to the full-scale value) of 4 time units. The maximum delay may be chosen to be equal to the duration of one cycle of fref. Clock f-div is obtained by dividing fref by the Ndiv2 values (4, 4, 4, 5) shown there. The start of the division by the corresponding Ndiv2 value occurs at t0 and at the corresponding falling edge of f-div, such as for example, time instances t251, t254, t257 and t259. The falling edges of f-div (145) are delayed by a duration specified by the corresponding value of Ndtc (1, 2, 3, 0, 1, 2, 3, 0 . . . ). Clock fout depicts the desired output signal with 50% duty cycle.

Since DSM 130 needs to generate a code-pair for each cycle of f-div (typically at the start of each f-div cycle), the internal implementation of DSM 130 needs to be fast enough to perform the necessary operations such that the two values constituting the 'next' code-pair must be generated and stable prior to the start of the next cycle of f-div. In the example provided herein, the next-code pair (i.e., all code-pairs except the very first) must be generated and stable prior to the next falling edge of clock f-div.

In an embodiment, DSM 130 is a first-order DSM. However, in other embodiments, higher order DSMs can also be used in place of DSM 130.

It may be desirable to implement DSM 130 such that it can support as high a clock frequency (i.e., speed) of f-div as possible. Several features of the present disclosure are directed to such an implementation of DSM 130.

The features of the present disclosure may be better understood in light of the details of a prior DSM, which is briefly provided next.

3. Prior DSM

Figure 3:
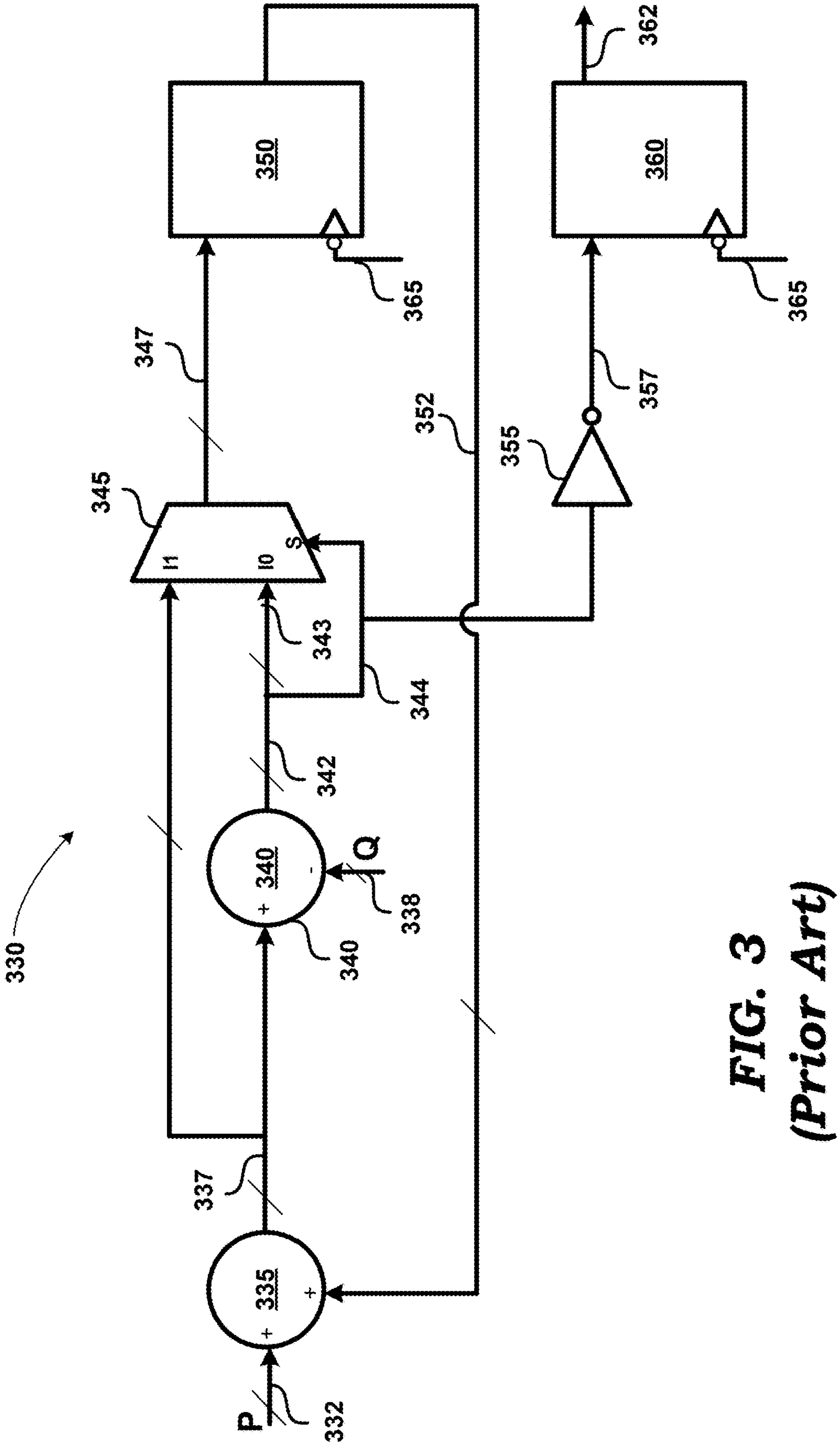
FIG. 3 (Prior Art)
FIG. 3 is a block diagram of a Delta Sigma Modulator (DSM) according to a prior implementation.

FIG. 3 is a block diagram of a prior DSM 330 which may be used in place of DSM 130 of FIG. 1. DSM 330 is shown containing adders 335 and 340, multiplexer 345, inverter 355, and D flip-flops 350 and 360. In FIG. 3, paths 332/338, 365, 362 and 352 respectively correspond to paths 107, 145, 132 and 135 of FIG. 1. Prior DSM 330 is shown to be a first-order DSM.

Adder 335 receives numerator (P) of fractional-component 107 on path 332 and output of D flip-flop 350 on path 352, adds the two values, and provides the resulting value on path 337. Adder 340 receives the signal on path 337 and denominator (Q) of fractional-component 107 on path 338, and provides their difference (e.g., in two's-complement form) on path 342.

Multiplexer (MUX) 345 receives on path 344 and the select(S) terminal the most significant bit (MSB) of signal 342. MUX 345 receives the remaining bits (LSBs) of signal 342 on input terminal (10) via path 343 and the signal on path 337 on input terminal (11), and forwards on path 347 one of the two inputs based on the(S) input on path 344.

Inverter 355 receives the MSB on path 344 and provides a logical inverse of the MSB on path 357. Flip-flop 350 stores signal 347 at each falling edge of clock 365, and provides the stored signal as Ndtc on path 352. Similarly, flip-flop 360 stores signal 357 at each falling edge of clock 365, and provides the stored signal as Ndiv1 on path 362.

As noted above, each of the code-pairs (362, 352) must be generated, and be stable and available for use at the start of each cycle of clock 365. Hence, the computations and operations of adders 335 and 340, MUX 345 and inverter 355 in generating each of the signals 347 and 357 must be complete, and signals 347 and 357 must be available and stable sufficiently prior to the clock edge at which flip-flops 350 and 360 store signals 347 and 357 respectively.

Depending on the specific application requirements, integers P and Q may each be represented using multiple bits. Adders 335 and 340 may therefore be designed to operate on multi-bit inputs and outputs. In general, larger the number of bits used for representing P and Q, more complex would be the implementation of each of adders 335 and 340, with each add or subtract operation requiring multiple smaller steps/operations, as is well known in the relevant arts. Correspondingly, the add/subtract operation in each cycle of f-div would require more time for completion. Further, it may be observed that adders 335 and 340 and MUX 345 are in a series connection, with adder 340 requiring the output of adder 335 to be available, and MUX 345 requiring the output of adder 340 to be available for each of their corresponding operations in each cycle of f-div. Similarly, adders 335 and 340 and inverter 355 are also in a series connection and pose similar constraints. Thus, prior DSM 330 has two adders and a MUX (or an inverter) in the 'critical paths' (time-sensitive signal paths).

Therefore, the maximum frequency of f-div allowing for the reliable operation of DSM 330 may be relatively limited/lower, making the prior implementation unsuitable for high-frequency operation.

A DSM implemented according to several aspects of the present disclosure enables faster operation, i.e., higher operating frequencies for its clock, f-div.

4. DSM of the Present Disclosure

Figure 4A:
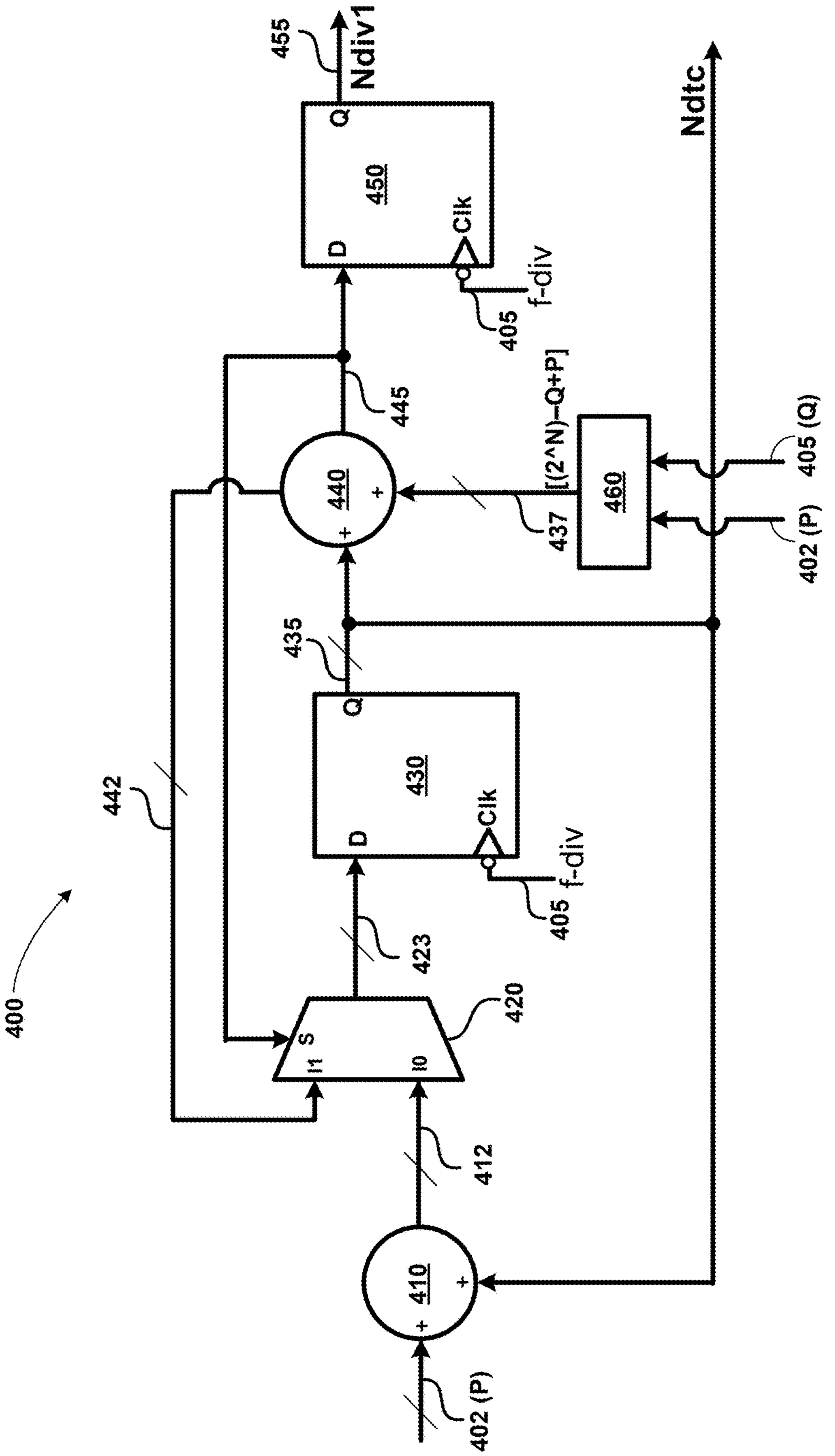
FIG. 4A is a block diagram of a DSM in an embodiment of the present disclosure.

FIG. 4A is a block diagram of a DSM (400) in an embodiment of the present disclosure. DSM 400, which can be used in place of DSM 130 of FIG. 1, is shown containing adders 410 and 440, multiplexer (MUX) 420, flip-flops (FF) 430 and 450, and logic block 460. Each of the blocks/components of DSM 400 can be implemented in a known way, and one of several known techniques can be employed for their implementation. The respective paths shown in FIG. 4 may have corresponding bit-widths, as will be apparent from the description herein. In an embodiment, each of paths 402, 412, 423, 435, 437 and 442 is N-bits wide, with N being an integer greater than 1. Paths 445 and 455 are each one-bit wide. Clock f-div (shown in FIG. 1) is received as a clock on path 405. In the embodiment, both FF 430 and 450 are negative-edge-triggered flip-flops. Outputs Ndiv1 (i.e., carry) and Ndtc (i.e., sum) of DSM 400 are provided on respective paths 455 and 435. Numerator P and denominator Q of the fractional-component (107 in FIG. 1) are received as input on respective paths 402 and 405.

DSM 400 is shown as a first order DSM merely by way of illustration. Higher order DSMs can be implemented using the structure of DSM 400 in a known way, as would be apparent to one skilled in the relevant arts. Further, the number of bits used for representing P and Q, as well as the width of the various paths in DSM 400 can be any positive integer. Also, the specific implementation of the blocks of DSM 400 are also shown merely by way of illustration, and other well-known implementations for these blocks can also be used instead. FF 430 and 450 can be positive edge-triggered flip-flops based on the specific requirements and implementation of a larger device/system (such as OLM 100 of FIG. 1) that needs to use DSM 400.

Logic block 460 receives P and Q and generates the value ((2^N)−Q+P) as an output on path 437. The value ((2^N)−Q+P) is the 2's complement representation of the negative number −(Q−P), when N bits are used to represent P and Q. 'N' is an integer equal to the number of bits used to represent P and Q. The symbol '^' represents the 'to the power of' operation. Block 460 can be implemented in a known way.

Adder 410 receives the numerator (P) on path 402 and the output of flip-flop 430 on path 435, and provides the added output (i.e., sum value of the two values (numbers)) on path 412.

MUX 420 forwards on path 423 the corresponding one of the respective inputs received at its inputs terminals I0 and I1 depending on the value of a binary 'select' signal received on its select(S) input terminal. Terminals 10, I1 and S are respectively connected to paths 412, 442 and 445.

FF 430 stores the value received at its data input (D) via path 423 at the corresponding falling-edge of clock 405. The stored value is available at its output terminal (Q), which is connected to path 435. FF 430 is shown as a flip-flop, but may in practice be implemented as an N-bit wide register clocked by clock 405.

Adder 440 receives the output of FF 430 on path 435 and the value ((2^N)−Q+P) on path 437, and computes the added output (i.e., the sum value of signals/values on paths 435 and 437), which is represented using (N+1) bits. Adder 440 forwards the most significant bit (MSB) of the computed added output on path 445 and the remaining bits (LSBs) of the added output on path 442. MSB 445 is a 1 when the value of the added output is equal to or greater than 2^N, else MSB 445 is a 0.

FF 450 stores the value received at its data input (D) via path 445 at the corresponding falling-edge of clock 405. The stored value is available at its output terminal (Q), which is connected to path 455. FF 430 is shown as a flip-flop, but may in practice be implemented as an N-bit wide register clocked by clock 405.

Ndiv1 on path 455 and Ndtc on path 435 are the outputs (i.e., carry and sum respectively) of DSM 400. Each of the components/blocks of DSM 400 can be implemented in a known way.

In operation, DSM 400 receives positive integers P and Q (Q being greater than P) which together represent the fractional portion of the divisor by which the frequency of a clock needs to be divided. In response, DSM 400 generates a sequence of code pairs, one code pair at each falling edge of clock 405. The first value in each code pair is an Ndiv1 value forwarded on path 455 and the second value is an Ndtc value forwarded on path 435. The Ndiv1 and Ndtc values of a pair are related. The sequence of code pairs repeats after every Q code pairs.

The design of DSM 400 exploits known relations/redundancies between the values of Ndtc of a previous cycle (of clock f-div), the number (Q−P), and the code pair (Ndiv1, Ndtc) to be generated for a current cycle, both P and Q also being known a priori. Specifically, if the Ndtc value of an immediately previous cycle of clock f-div is less than (Q−P), then Ndtc for the current cycle (generated on path 435) is the summation of P and the Ndte value of the immediately preceding clock cycle, with Ndiv being a 0 for the current cycle. Otherwise, i.e., if the Ndtc value of an immediately previous cycle of clock f-div is equal to or greater than (Q−P), then the Ndtc value for the current cycle (435) is the difference of the Ndte of the immediately preceding clock cycle and (Q−P), with Ndiv1 being a 1 for the current cycle.

It may be observed from the block diagram of DSM 400 in FIG. 4A that the blocks therein are connected in a manner that exploits the above-noted relations/redundancies, and to thereby generate Ndtc and Ndiv1 using the relations noted above. Specifically, to generate Ndtc, in each clock cycle of f-div, signal 423 must be computed/updated and be stable sufficiently earlier than the storing (negative) clock edge of f-div (405) (as required by the set-up time of FF 430) for generation of Ndtc on path 435. Therefore, either one addition operation in adder 410 and select-and-forward operation in MUX 420, or one addition operation in adder 440 and select-and-forward operation in MUX 420, must happen in each clock cycle to reliable generate Ndtc. To generate Ndiv1, one addition operation must happen in adder 440. Thus, compared to prior DSM 330 that contains two adders in a critical path, DSM 400 contains only one adder in a critical path, and therefore DSM 400 is capable of operating at higher clock frequencies than prior DSM 330.

An illustration of the manner in which DSM 400 as implemented in FIG. 4A generates Ndtc and Ndiv1 values is now provided with respect to the entries of table 460 of FIG. 4B. The entries show the values at various paths of DSM 400 as noted there for two repetitions of the code-pair sequence, and for the values of P being 3 and Q being 5, the fractional-component thus being ⅗, i.e., 0.6 in decimal. DSM 400 receives 3 and 5 as the values of P and Q respectively, and generates a repeating code-pair sequence of [(0, 3), (1, 1), (0, 4), (1, 2) and (1, 0)].

In table 460 in FIG. 4B, column 461 specifies the number of the clock-cycle. For each clock cycle in column 461, column 462 contains the value of P on path 402, column 463 contains the value of the signal on path 412, column 464 contains the value of the signal on path 423, column 465 contains the value of the signal (Ndtc) on path 435, column 466 contains the value of the signal on path 437, column 467 contains the value of the signal on path 442, column 468 contains the value of the signal on path 445, and column 469 contains the value of the signal on path 455 (Ndiv1). The signals (digital values) in columns 462-469 are in binary form with the corresponding decimal equivalents specified in brackets. Thus, for example, row 481 contains the value of the corresponding signals for the $0^{th}$ clock-cycle. Rows 482-491 of table 460 specify the respective values at the following clock-cycles.

For the $0^{th}$ clock-cycle (start of operation), the respective outputs of FFs 430 and 450 on paths 435 and 455 are 0. Adder 410 receives 011 (3; P) on path 402 and 000 (0) on path 435, and provides 011 (3) on path 412. Adder 440 receives 110 (6) on path 437, 000 (0) on path 435, and generates an added output 0110 whose MSB '0' is provided on path 445 and the LSBs '110' are provided on path 442. Multiplexer 420 receives 0 on path 445 (i.e., the MSB) as a 'select' signal, 110 (6) (i.e., the LSBs) as I1 data input, 011 (3) on path 412 as I0 data input, and provides 011 (3) as the selected signal on path 423. FF 430 receives 011 (3) on path 423 as a data input and FF 450 receives 0 on path 445 as a data input. At the falling-edge of the $1^{st}$ clock-cycle, FF 430 provides 011 (3) as output on path 435 and FF 450 provides 0 as output on path 455. The signal values for clock-cycles 2 to 10 are shown as the other entries of table 460.

Referring now to FIG. 1 and assuming the value of the integer-component (105) to be '1', adder 120 adds each of the received Ndiv1 values (i.e., 0, 1, 0, 1, and 1) to the integer-component (105) (i.e., 1) and forwards the resulting value (i.e., 1, 2, 1, 2 and 2) on path Ndiv2 (133). Ndtc (135) of each pair contains the value of a corresponding duration of time by which the corresponding (falling) edge of f-div (145) is to be delayed. Clocks f-frac and fout are obtained with frequencies that are the desired fraction of that of fref. Thus, DSM 400 containing only one adder in the critical path is capable of operating at higher clock frequencies.

5. Conclusion

References throughout this specification to "one embodiment", "an embodiment", or similar language means that a particular feature, structure, or characteristic described in connection with the embodiment is included in at least one embodiment of the present disclosure. Thus, appearances of the phrases "in one embodiment", "in an embodiment" and similar language throughout this specification may, but do not necessarily, all refer to the same embodiment.

While in the illustrations of FIGS. 1, 3 and 4A, although terminals/nodes are shown with direct connections to (i.e., "connected to") various other terminals, it should be appreciated that additional components (as suited for the specific environment) may also be present in the path, and accordingly the connections may be viewed as being "electrically coupled" or just "coupled", to the same connected terminals.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. A Delta Sigma Modulator (DSM) to generate a sequence of pairs in corresponding sequence of clock cycles based on a numerator and a denominator together representing a fraction, wherein each pair contains a sum and a carry, said DSM comprising:

a first memory element to output a sequence of sums;

a second memory element to output a sequence of carries, wherein each sum of said sequence of sums and a corresponding carry of said sequence of carries together constitute a pair of said sequence of pairs; and a first adder and a second adder, an output of said first adder coupled to an input of said first memory element and an output of said second adder being coupled to an input of said second memory element, wherein a plurality of signal paths are present between a start point of a set of start points and an end point of a set of end points, wherein said set of start points comprise inputs to said DSM and data output of said first memory, and wherein said set of end points comprise inputs of said first memory element and said second memory element, wherein only a single adder of said first adder and said second adder is present in any of said plurality of signal paths.

2. The DSM of claim 1, wherein said inputs to said DSM comprise said numerator (P) and said denominator (Q), said DSM further comprising a logic block to receive said numerator (P) and said denominator (Q), and to generate a value equaling [(2^N)−Q+P], where N represents a number of bits used to represent each of said numerator and said denominator, wherein P is less than Q, and '^' represents a 'to the power of' operation.

3. The DSM of claim 2, wherein said first adder to generate a first added output for each clock cycle by adding said numerator and a sum of an immediately previous clock cycle, said second adder to generate a second added output for each cycle by adding said sum of said immediately previous clock cycle and said value, wherein said second added output contains a most significant bit (MSB) and remaining lesser significant bits (LSBs), said DSM further comprising:

a multiplexer to select one of said first added output and said LSBs according to said MSB used as a selection input, and wherein said selected data is provided as a data input to said first memory element and said MSB is provided as a data input to said second memory element.

4. The DSM of claim 3, wherein said multiplexer selects said first added output when said MSB is '0' and said LSBs when said MSB is '1'.

5. The DSM of claim 3, wherein each of said first memory element and said second memory element comprises a corresponding flip-flop.

6. The DSM of claim 3, wherein said MSB is '0' if said sum of said immediately previous cycle is less than (Q−P) and '1' if said sum of said immediately previous cycle is equal to greater than (Q−P), wherein said multiplexer selects said first added output when said MSB is '0' and said LSBs when said MSB is '1', and wherein said first memory element outputs said selected data as said sum, and said second memory element outputs said MSB as said carry.

7. The DSM of claim 1, wherein said DSM is a first-order DSM.

8. An open-loop modulator (OLM) for generating a fractional output clock having a frequency which is a desired fraction of that of a reference clock, wherein said desired fraction is represented by an integer component and a fractional component, said OLM comprising:

a multi-modulus frequency divider (MMFD) coupled to receive said reference clock and a first sequence of first codes, said MMFD to divide a frequency of said reference clock by a corresponding first code in said first sequence of first codes in a corresponding duration to generate a divided signal;

a digital-to-time converter (DTC) coupled to receive said divided signal and a second sequence of second codes, said DTC designed to delay edges of interest of said divided signal according to a corresponding second code in said second sequence of second codes in said corresponding duration to generate said fractional output clock; and a delta-sigma modulator (DSM) coupled to receive said fractional component and to generate, in each corresponding cycle of said divided signal, a corresponding code-pair, each code-pair comprising a sum and a carry, said DSM comprising:

a first memory element to output a sequence of sums;

a second memory element to output a sequence of carries, wherein each sum of said sequence of sums and a corresponding carry of said sequence of carries together constitute a code-pair of said sequence of code-pairs; and a first adder and a second adder, an output of said first adder coupled to an input of said first memory element and an output of said second adder being coupled to an input of said second memory element, wherein a plurality of signal paths are present between a start point of a set of start points and an end point of a set of end points, wherein said set of start points comprise inputs to said DSM and data output of said first memory, and wherein said set of end points comprise inputs of said first memory element and said second memory element, wherein only a single adder of said first adder and said second adder is present in any of said plurality of signal paths, wherein said corresponding first code is formed by adding said integer component to said corresponding carry, and wherein said corresponding sum forms said corresponding second code.

9. The OLM of claim 8, wherein said fractional component comprises a numerator (P) and a denominator (Q), said DSM further comprising a logic block to receive said numerator (P) and denominator (Q), and to generate a value equaling [(2^N)−Q+P], wherein N represents a number of bits used to represent each of said numerator and said denominator, wherein P is less than Q, and 'A' represents a 'to the power of' operation.

10. The OLM of claim 9, wherein said first adder to generate a first added output for each clock cycle by adding said numerator and a sum of an immediately previous clock cycle, said second adder to generate a second added output for each cycle by adding said sum of said immediately previous clock cycle and said value, wherein said second added output contains a most significant bit (MSB) and remaining lesser significant bits (LSBs), said DSM further comprising:

a multiplexer to select one of said first added output and said LSBs according to said MSB used as a selection input, and wherein said selected data is provided as a data input to said first memory element and said MSB is provided as a data input to said second memory element.

11. The OLM of claim 10, wherein said multiplexer selects said first added output when said MSB is '0' and said LSBs when said MSB is '1'.

12. The OLM of claim 10, wherein each of said first memory element and said second memory element comprises a corresponding flip-flop.

13. The OLM of claim 8, wherein said DSM is a first-order DSM.

14. The OLM of claim 10, wherein said MSB is '0' if said sum of said immediately previous cycle is less than (Q−P) and '1' if said sum of said immediately previous cycle is equal to greater than (Q−P), wherein said multiplexer selects said first added output when said MSB is '0' and said LSBs when said MSB is '1', and wherein said first memory element outputs said selected data as said sum, and said second memory element outputs said MSB as said carry.

15. A Delta Sigma Modulator (DSM) to generate a sequence of pairs in corresponding sequence of clock cycles of a clock signal based on a numerator and a denominator together representing a fraction, wherein each pair contains a sum and a carry, said DSM comprising:

a logic block to receive said numerator (P) and said denominator (Q), and to generate a value equaling [(2/\N)−Q+P], where N represents a number of bits used to represent each of said numerator and said denominator, wherein P is less than Q, and '/\' represents a 'to the power of' operation;

a first memory element and a second memory element;

a first adder and a second adder; and a multiplexer, wherein said first adder is coupled to receive said numerator and an output of said first memory element as inputs, and wherein an output of said first adder is coupled to a first data input of said multiplexer, wherein said second adder is coupled to receive said output of said first memory element and said value as inputs, wherein an output of said second adder contains a most significant bit (MSB) and remaining lesser significant bits (LSBs), and wherein said MSB is coupled to a select input of said multiplexer and to a data input of said second memory element, and said LSBs are coupled to a second data input of said multiplexer, wherein an output of said multiplexer is coupled to a data input of said first memory element, wherein a clock input of said first memory element and a clock input of said second memory element are coupled to receive said clock signal, and wherein said output of said first memory element forms said sum and wherein an output of said second memory element forms said carry.

* * * * *